United States Patent
Tois et al.

(10) Patent No.: US 11,804,373 B2
(45) Date of Patent: *Oct. 31, 2023

(54) SELECTIVE LAYER FORMATION USING DEPOSITION AND REMOVING

(71) Applicant: ASM IP HOLDING B.V., Almere (NL)

(72) Inventors: Eva E. Tois, Helsinki (FI); Viljami J. Pore, Helsinki (FI)

(73) Assignee: ASM IP Holding, B.V., Almere (NL)

( * ) Notice: Subject to any disclaimer, the term of this patent is extended or adjusted under 35 U.S.C. 154(b) by 0 days.

This patent is subject to a terminal disclaimer.

(21) Appl. No.: 17/934,817

(22) Filed: Sep. 23, 2022

(65) Prior Publication Data

US 2023/0016537 A1 Jan. 19, 2023

Related U.S. Application Data

(63) Continuation of application No. 17/113,383, filed on Dec. 7, 2020, now Pat. No. 11,501,966, which is a
(Continued)

(51) Int. Cl.
*H01L 21/02* (2006.01)
*C23C 16/455* (2006.01)
(Continued)

(52) U.S. Cl.
CPC .......... *H01L 21/0228* (2013.01); *C23C 16/40* (2013.01); *C23C 16/45536* (2013.01);
(Continued)

(58) Field of Classification Search
CPC .......... H01L 21/0228; H01L 21/02164; H01L 21/02172; H01L 21/02211;
(Continued)

(56) References Cited

U.S. PATENT DOCUMENTS 4,804,640 A 2/1989 Kaganowicz
4,863,879 A 9/1989 Kwok
(Continued)

FOREIGN PATENT DOCUMENTS

EP 0469456 2/1992
EP 0880168 11/1998
(Continued)

OTHER PUBLICATIONS

Aaltonen et al. (2004) Atomic layer deposition of iridium thin films. Journal of the Electrochemical Society. 151(8):G489-G492.
(Continued)

*Primary Examiner* — Ratisha Mehta
(74) *Attorney, Agent, or Firm* — Banner & Witcoff, Ltd.

(57) ABSTRACT

Methods and systems for selectively depositing dielectric films on a first surface of a substrate relative to a passivation layer previously deposited on a second surface are provided. The methods can include at least one cyclical deposition process used to deposit material on the first surface while the passivation layer is removed, thereby preventing deposition over the passivation layer.

20 Claims, 3 Drawing Sheets

Related U.S. Application Data continuation of application No. 16/399,328, filed on Apr. 30, 2019, now Pat. No. 10,872,765.

(60) Provisional application No. 62/666,039, filed on May 2, 2018.

(51) Int. Cl.
*H01L 21/3105* (2006.01)
*C23C 16/40* (2006.01)

(52) U.S. Cl.
CPC .. *C23C 16/45553* (2013.01); *H01L 21/02164* (2013.01); *H01L 21/02172* (2013.01); *H01L 21/02211* (2013.01); *H01L 21/02274* (2013.01); *H01L 21/31058* (2013.01)

(58) Field of Classification Search
CPC ......... H01L 21/31058; C23C 16/45553; C23C 16/40; C23C 16/45536
See application file for complete search history.

(56) References Cited

U.S. PATENT DOCUMENTS

| | | | |
|---|---|---|---|
| 4,948,755 A | 8/1990 | Mo | |
| 5,288,697 A | 2/1994 | Schrepp et al. | |
| 5,447,887 A | 9/1995 | Filipiak et al. | |
| 5,604,153 A | 2/1997 | Tsubouchi et al. | |
| 5,633,036 A | 5/1997 | Seebauer et al. | |
| 5,869,135 A | 2/1999 | Vaeth et al. | |
| 5,925,494 A | 7/1999 | Horn | |
| 6,046,108 A | 4/2000 | Liu et al. | |
| 6,416,577 B1 | 7/2002 | Suntola et al. | |
| 6,455,414 B1 | 9/2002 | Hillman et al. | |
| 6,482,740 B2 | 11/2002 | Soininen et al. | |
| 6,586,330 B1 | 7/2003 | Ludviksson et al. | |
| 6,679,951 B2 | 1/2004 | Soininen et al. | |
| 6,759,325 B2 | 7/2004 | Raaijmakers et al. | |
| 6,811,448 B1 | 11/2004 | Paton | |
| 6,844,258 B1 | 1/2005 | Fair et al. | |
| 6,858,533 B2 | 2/2005 | Chu et al. | |
| 6,878,628 B2 | 4/2005 | Sophie et al. | |
| 6,887,795 B2 | 5/2005 | Soininen et al. | |
| 6,921,712 B2 | 7/2005 | Soininen et al. | |
| 6,958,174 B1 | 10/2005 | Klaus et al. | |
| 7,041,609 B2 | 5/2006 | Vaartstra | |
| 7,067,407 B2 | 6/2006 | Kostamo et al. | |
| 7,084,060 B1 | 8/2006 | Furukawa et al. | |
| 7,118,779 B2 | 10/2006 | Verghese et al. | |
| 7,220,669 B2 | 5/2007 | Hujanen et al. | |
| 7,241,677 B2 | 7/2007 | Soininen et al. | |
| 7,323,411 B1 | 1/2008 | Blosse | |
| 7,405,143 B2 | 7/2008 | Leinikka et al. | |
| 7,425,350 B2 | 9/2008 | Todd | |
| 7,476,618 B2 | 1/2009 | Kilpela et al. | |
| 7,494,927 B2 | 2/2009 | Kostamo et al. | |
| 7,595,271 B2 | 9/2009 | White | |
| 7,611,751 B2 | 11/2009 | Elers | |
| 7,695,567 B2 | 4/2010 | Fu | |
| 7,754,621 B2 | 7/2010 | Putkonen | |
| 7,790,631 B2 | 9/2010 | Sharma et al. | |
| 7,799,135 B2 | 9/2010 | Verghese et al. | |
| 7,910,177 B2 | 3/2011 | Li | |
| 7,914,847 B2 | 3/2011 | Verghese et al. | |
| 7,927,942 B2 | 4/2011 | Raaijmakers | |
| 7,951,637 B2 | 5/2011 | Weidman et al. | |
| 7,955,979 B2 | 6/2011 | Kostamo et al. | |
| 7,964,505 B2 | 6/2011 | Khandelwal et al. | |
| 8,030,212 B2 | 10/2011 | Yang et al. | |
| 8,084,087 B2 | 12/2011 | Bent et al. | |
| 8,293,597 B2 | 10/2012 | Raaijmakers | |
| 8,293,658 B2 | 10/2012 | Shero et al. | |
| 8,425,739 B1 | 4/2013 | Wieting | |
| 8,536,058 B2 | 9/2013 | Kostamo et al. | |
| 8,623,468 B2 | 1/2014 | Lin et al. | |
| 8,778,815 B2 | 7/2014 | Yamaguchi et al. | |
| 8,890,264 B2 | 11/2014 | Dewey et al. | |
| 8,956,971 B2 | 2/2015 | Haukka et al. | |
| 8,962,482 B2 | 2/2015 | Albertson et al. | |
| 8,980,418 B2 | 3/2015 | Darling et al. | |
| 8,993,404 B2 | 3/2015 | Korbrinsky et al. | |
| 9,067,958 B2 | 6/2015 | Romero | |
| 9,112,003 B2 | 8/2015 | Haukka et al. | |
| 9,129,897 B2 | 9/2015 | Pore et al. | |
| 9,136,110 B2 | 9/2015 | Rathsack | |
| 9,159,558 B2 | 10/2015 | Cheng et al. | |
| 9,236,292 B2 | 1/2016 | Romero et al. | |
| 9,257,303 B2 | 2/2016 | Haukka et al. | |
| 9,349,687 B1 | 5/2016 | Gates et al. | |
| 9,455,138 B1 | 9/2016 | Fukazawa et al. | |
| 9,490,145 B2 | 11/2016 | Niskanen et al. | |
| 9,502,289 B2 | 11/2016 | Haukka et al. | |
| 9,512,541 B2 | 12/2016 | Shimizu et al. | |
| 9,552,979 B2 | 1/2017 | Knaepen et al. | |
| 9,679,808 B2 | 6/2017 | Haukka et al. | |
| 9,754,779 B1 | 9/2017 | Ishikawa et al. | |
| 9,786,491 B2 | 10/2017 | Suzuki et al. | |
| 9,786,492 B2 | 10/2017 | Suzuki et al. | |
| 9,803,277 B1 | 10/2017 | Longrie et al. | |
| 9,805,974 B1 | 10/2017 | Chen et al. | |
| 9,816,180 B2 | 11/2017 | Haukka et al. | |
| 9,895,715 B2 | 2/2018 | Haukka et al. | |
| 9,911,595 B1 | 3/2018 | Smith et al. | |
| 10,014,212 B2 | 7/2018 | Chen et al. | |
| 10,041,166 B2 | 8/2018 | Longrie et al. | |
| 10,047,435 B2 | 8/2018 | Haukka et al. | |
| 10,049,924 B2 | 8/2018 | Haukka et al. | |
| 10,115,603 B2 | 10/2018 | Niskanen et al. | |
| 10,157,786 B2 | 12/2018 | Haukka et al. | |
| 10,186,420 B2 | 1/2019 | Fukazawa | |
| 10,204,782 B2 | 2/2019 | Maes et al. | |
| 10,316,406 B2 | 6/2019 | Lecordier | |
| 10,343,186 B2 | 7/2019 | Pore et al. | |
| 10,373,820 B2 | 8/2019 | Tois et al. | |
| 10,378,105 B2 | 8/2019 | Yu et al. | |
| 10,378,810 B2 | 8/2019 | Yu et al. | |
| 10,428,421 B2 | 10/2019 | Haukka et al. | |
| 10,443,123 B2 | 10/2019 | Haukka et al. | |
| 10,453,701 B2 | 10/2019 | Tois et al. | |
| 10,480,064 B2 | 11/2019 | Longrie et al. | |
| 10,508,337 B2 | 12/2019 | Iwaji | |
| 10,546,741 B2 | 1/2020 | Muramaki et al. | |
| 10,695,794 B2 | 6/2020 | Pore et al. | |
| 10,872,765 B2 | 12/2020 | Tois et al. | |
| 11,501,966 B2 * | 11/2022 | Tois | H01L 21/02175 |
| 2001/0019803 A1 | 9/2001 | Mirkanimi | |
| 2001/0025205 A1 | 9/2001 | Chern et al. | |
| 2002/0027261 A1 | 3/2002 | Blesser et al. | |
| 2002/0047144 A1 | 4/2002 | Nguyen et al. | |
| 2002/0068458 A1 | 6/2002 | Chiang et al. | |
| 2002/0090777 A1 | 7/2002 | Forbes et al. | |
| 2002/0107316 A1 | 8/2002 | Bice et al. | |
| 2003/0027431 A1 | 2/2003 | Sneh et al. | |
| 2003/0066487 A1 | 4/2003 | Suzuki | |
| 2003/0143839 A1 | 7/2003 | Raaijmakers et al. | |
| 2003/0176559 A1 | 9/2003 | Bice et al. | |
| 2003/0181035 A1 | 9/2003 | Yoon et al. | |
| 2003/0185997 A1 | 10/2003 | Hsieh | |
| 2003/0192090 P1 | 10/2003 | Meilland | |
| 2003/0193090 A1 | 10/2003 | Otani et al. | |
| 2004/0092073 A1 | 5/2004 | Cabral | |
| 2004/0219746 A1 | 11/2004 | Vaartstra et al. | |
| 2005/0012975 A1 | 1/2005 | George et al. | |
| 2005/0136604 A1 | 6/2005 | Al-Bayati et al. | |
| 2005/0160575 A1 | 7/2005 | Gambino et al. | |
| 2005/0223989 A1 | 10/2005 | Lee et al. | |
| 2006/0019493 A1 | 1/2006 | Li | |
| 2006/0047132 A1 | 3/2006 | Shenai-Khatkhate et al. | |
| 2006/0121271 A1 | 6/2006 | Frey et al. | |
| 2006/0121733 A1 | 6/2006 | Kilpela et al. | |
| 2006/0128150 A1 | 6/2006 | Gandikota et al. | |
| 2006/0141155 A1 | 6/2006 | Gordon et al. | |
| 2006/0156979 A1 | 7/2006 | Thakur et al. | |
| 2006/0176559 A1 | 8/2006 | Takatoshi et al. | |

(56) References Cited

U.S. PATENT DOCUMENTS

| | | |
|---|---|---|
| 2006/0199399 A1 | 9/2006 | Muscat |
| 2006/0226409 A1 | 10/2006 | Burr et al. |
| 2006/0292845 A1 | 12/2006 | Chiang et al. |
| 2007/0014919 A1 | 1/2007 | Hamalainen et al. |
| 2007/0026654 A1 | 2/2007 | Huotari et al. |
| 2007/0063317 A1 | 3/2007 | Kim et al. |
| 2007/0098894 A1 | 5/2007 | Verghese et al. |
| 2007/0099422 A1 | 5/2007 | Wijekoon et al. |
| 2007/0232082 A1 | 10/2007 | Balseanu et al. |
| 2007/0241390 A1 | 10/2007 | Tanaka et al. |
| 2007/0251444 A1 | 11/2007 | Gros-Jean et al. |
| 2007/0292604 A1 | 12/2007 | Dordi et al. |
| 2008/0066680 A1 | 3/2008 | Sherman |
| 2008/0072819 A1 | 3/2008 | Rahtu |
| 2008/0124932 A1 | 5/2008 | Tateishi et al. |
| 2008/0179741 A1 | 7/2008 | Streck et al. |
| 2008/0241575 A1 | 10/2008 | Lavoie et al. |
| 2008/0282970 A1 | 11/2008 | Heys et al. |
| 2009/0035949 A1 | 2/2009 | Niinisto et al. |
| 2009/0071505 A1 | 3/2009 | Miya et al. |
| 2009/0081385 A1 | 3/2009 | Heys et al. |
| 2009/0081827 A1 | 3/2009 | Yang et al. |
| 2009/0203222 A1 | 8/2009 | Dussarrat et al. |
| 2009/0269507 A1 | 10/2009 | Yu et al. |
| 2009/0274887 A1 | 11/2009 | Millward et al. |
| 2009/0275163 A1 | 11/2009 | Lacey et al. |
| 2009/0311879 A1 | 12/2009 | Blasco et al. |
| 2010/0015756 A1 | 1/2010 | Weidman et al. |
| 2010/0102417 A1 | 4/2010 | Ganguli et al. |
| 2010/0147396 A1 | 6/2010 | Yamagishi et al. |
| 2010/0178468 A1 | 7/2010 | Jiang et al. |
| 2010/0248473 A1 | 9/2010 | Ishizaka et al. |
| 2010/0270626 A1 | 10/2010 | Raisanen |
| 2010/0297474 A1 | 11/2010 | Dameron |
| 2010/0314765 A1 | 12/2010 | Liang et al. |
| 2011/0039420 A1 | 2/2011 | Nakao |
| 2011/0053800 A1 | 3/2011 | Jung et al. |
| 2011/0120542 A1 | 5/2011 | Levy |
| 2011/0124192 A1 | 5/2011 | Ganguli et al. |
| 2011/0146568 A1 | 6/2011 | Haukka et al. |
| 2011/0146703 A1 | 6/2011 | Chen et al. |
| 2011/0221061 A1 | 9/2011 | Prakash |
| 2011/0244680 A1 | 10/2011 | Tohnoe et al. |
| 2011/0311726 A1 | 12/2011 | Liu et al. |
| 2012/0032311 A1 | 2/2012 | Gates |
| 2012/0046421 A1 | 2/2012 | Darling et al. |
| 2012/0052681 A1 | 3/2012 | Marsh |
| 2012/0088369 A1 | 4/2012 | Weidman et al. |
| 2012/0189868 A1 | 7/2012 | Borovik et al. |
| 2012/0219824 A1 | 8/2012 | Prolier et al. |
| 2012/0241411 A1 | 9/2012 | Darling et al. |
| 2012/0264291 A1 | 10/2012 | Ganguli et al. |
| 2012/0269970 A1 | 10/2012 | Ido et al. |
| 2013/0005133 A1 | 1/2013 | Lee et al. |
| 2013/0078793 A1 | 3/2013 | Sun et al. |
| 2013/0089983 A1 | 4/2013 | Sugita et al. |
| 2013/0095664 A1 | 4/2013 | Matero et al. |
| 2013/0115763 A1 | 5/2013 | Takamure et al. |
| 2013/0115768 A1 | 5/2013 | Pore et al. |
| 2013/0126815 A1 | 5/2013 | Kim et al. |
| 2013/0143401 A1 | 6/2013 | Yu et al. |
| 2013/0146881 A1 | 6/2013 | Yamazaki et al. |
| 2013/0157409 A1 | 6/2013 | Vaidya et al. |
| 2013/0189837 A1 | 7/2013 | Haukka et al. |
| 2013/0196502 A1 | 8/2013 | Haukka et al. |
| 2013/0203267 A1 | 8/2013 | Pomarede et al. |
| 2013/0280919 A1 | 10/2013 | Yuasa et al. |
| 2013/0284094 A1 | 10/2013 | Pavol et al. |
| 2013/0309457 A1 | 11/2013 | Rathsack et al. |
| 2013/0316080 A1 | 11/2013 | Yamaguchi et al. |
| 2013/0323930 A1 | 12/2013 | Chattopadhyay et al. |
| 2014/0001572 A1 | 1/2014 | Bohr et al. |
| 2014/0024200 A1 | 1/2014 | Kato et al. |
| 2014/0091308 A1 | 4/2014 | Dasgupta et al. |
| 2014/0120738 A1 | 5/2014 | Jung et al. |
| 2014/0152383 A1 | 6/2014 | Nikonov et al. |
| 2014/0190409 A1 | 7/2014 | Matsumoto et al. |
| 2014/0193598 A1 | 7/2014 | Traser et al. |
| 2014/0205766 A1 | 7/2014 | Lyon et al. |
| 2014/0209022 A1 | 7/2014 | Inoue et al. |
| 2014/0227461 A1 | 8/2014 | Darwish et al. |
| 2014/0272194 A1 | 9/2014 | Xiao et al. |
| 2014/0273290 A1 | 9/2014 | Somervell |
| 2014/0273477 A1 | 9/2014 | Niskanen et al. |
| 2014/0273514 A1 | 9/2014 | Somervell et al. |
| 2014/0273523 A1 | 9/2014 | Rathsack |
| 2014/0273527 A1 | 9/2014 | Niskanen et al. |
| 2015/0004806 A1 | 1/2015 | Ndiege et al. |
| 2015/0011032 A1 | 1/2015 | Kunimatsu et al. |
| 2015/0011093 A1 | 1/2015 | Singh et al. |
| 2015/0037972 A1 | 2/2015 | Danek et al. |
| 2015/0064931 A1 | 3/2015 | Kumagi et al. |
| 2015/0083415 A1 | 3/2015 | Monroe et al. |
| 2015/0087158 A1 | 3/2015 | Sugita et al. |
| 2015/0093890 A1 | 4/2015 | Blackwell et al. |
| 2015/0097292 A1 | 4/2015 | He et al. |
| 2015/0118863 A1 | 4/2015 | Rathod et al. |
| 2015/0162214 A1 | 6/2015 | Thompson et al. |
| 2015/0170961 A1 | 6/2015 | Romero et al. |
| 2015/0179798 A1 | 6/2015 | Clendenning et al. |
| 2015/0217330 A1* | 8/2015 | Haukka ............... C23C 18/1208 427/343 |
| 2015/0240121 A1 | 8/2015 | Sugita et al. |
| 2015/0270140 A1 | 9/2015 | Gupta et al. |
| 2015/0275355 A1 | 10/2015 | Mallikarjunan et al. |
| 2015/0299848 A1 | 10/2015 | Haukka et al. |
| 2015/0371866 A1 | 12/2015 | Chen et al. |
| 2015/0376211 A1 | 12/2015 | Girard et al. |
| 2016/0075884 A1 | 3/2016 | Chen |
| 2016/0079524 A1 | 3/2016 | Do et al. |
| 2016/0086850 A1 | 3/2016 | Romero et al. |
| 2016/0172189 A1 | 6/2016 | Tapily |
| 2016/0186004 A1 | 6/2016 | Hustad et al. |
| 2016/0190060 A1 | 6/2016 | Bristol et al. |
| 2016/0222504 A1 | 8/2016 | Haukka et al. |
| 2016/0247695 A1* | 8/2016 | Niskanen .......... H01L 21/32135 |
| 2016/0276208 A1 | 9/2016 | Haukka et al. |
| 2016/0284568 A1 | 9/2016 | Morris et al. |
| 2016/0293398 A1 | 10/2016 | Danek et al. |
| 2016/0346838 A1 | 12/2016 | Fujita et al. |
| 2016/0365280 A1 | 12/2016 | Brink et al. |
| 2017/0037513 A1 | 2/2017 | Haukka et al. |
| 2017/0040164 A1 | 2/2017 | Wang et al. |
| 2017/0058401 A1 | 3/2017 | Blackwell et al. |
| 2017/0069527 A1 | 3/2017 | Haukka et al. |
| 2017/0100742 A1 | 4/2017 | Pore et al. |
| 2017/0100743 A1 | 4/2017 | Pore et al. |
| 2017/0107413 A1 | 4/2017 | Wang et al. |
| 2017/0154806 A1 | 6/2017 | Wang et al. |
| 2017/0298503 A1 | 10/2017 | Maes et al. |
| 2017/0301542 A1 | 10/2017 | Maes et al. |
| 2017/0323776 A1 | 11/2017 | Färm et al. |
| 2017/0332179 A1 | 11/2017 | Bright et al. |
| 2017/0352533 A1 | 12/2017 | Tois et al. |
| 2017/0352550 A1 | 12/2017 | Tois et al. |
| 2018/0040708 A1 | 2/2018 | Narayanan et al. |
| 2018/0080121 A1 | 3/2018 | Longrie et al. |
| 2018/0151345 A1 | 5/2018 | Haukka et al. |
| 2018/0151355 A1 | 5/2018 | Fukazawa |
| 2018/0182618 A1 | 6/2018 | Blanquart et al. |
| 2018/0190489 A1 | 7/2018 | Li et al. |
| 2018/0222933 A1 | 8/2018 | Romero |
| 2018/0233350 A1 | 8/2018 | Tois et al. |
| 2019/0017170 A1 | 1/2019 | Sharma et al. |
| 2019/0057858 A1 | 2/2019 | Hausmann et al. |
| 2019/0074441 A1 | 3/2019 | Kikuchi et al. |
| 2019/0155159 A1 | 5/2019 | Knaepen et al. |
| 2019/0283077 A1 | 9/2019 | Pore et al. |
| 2019/0333761 A1 | 10/2019 | Tois et al. |
| 2019/0341245 A1 | 11/2019 | Tois et al. |
| 2020/0051829 A1 | 2/2020 | Tois et al. |

(56) References Cited

U.S. PATENT DOCUMENTS

| | | |
|---|---|---|
| 2020/0066512 A1 | 2/2020 | Tois et al. |
| 2021/0118669 A1 | 4/2021 | Tois et al. |

FOREIGN PATENT DOCUMENTS

| | | |
|---|---|---|
| EP | 1340269 | 2/2009 |
| JP | 2004-281479 | 10/2004 |
| JP | 4333900 | 9/2009 |
| JP | 2010-232316 | 10/2010 |
| JP | 2011-187583 | 9/2011 |
| JP | 2014-093331 | 5/2014 |
| JP | 2017-222928 | 12/2017 |
| KR | 102001001072 | 2/2001 |
| KR | 20030027392 | 4/2003 |
| KR | 1020040056026 | 6/2004 |
| KR | 10-0869326 | 11/2008 |
| KR | 10-0920033 | 10/2009 |
| KR | 10-2012-0120902 | 11/2012 |
| KR | 2017-0046591 | 5/2017 |
| TW | 175767 | 8/2003 |
| TW | 2005-39321 | 12/2005 |
| TW | 2010-05827 | 2/2010 |
| TW | 2014-39365 | 10/2014 |
| WO | WO 2002/045167 | 6/2002 |
| WO | WO 2011/156705 | 12/2011 |
| WO | WO 2013/161772 | 10/2013 |
| WO | WO 2014/156782 | 10/2014 |
| WO | WO 2014/209390 | 12/2014 |
| WO | WO 2015/047345 | 4/2015 |
| WO | WO 2015/094305 | 6/2015 |
| WO | WO 2015/147843 | 10/2015 |
| WO | WO 2015/147858 | 10/2015 |
| WO | WO 2017/184357 | 10/2017 |
| WO | WO 2017/184358 | 10/2017 |
| WO | WO 2018/204709 | 11/2018 |
| WO | WO 2018/213018 | 11/2018 |

OTHER PUBLICATIONS

Au et al., "Selective Chemical Vapor Deposition of Manganese Self-Aligned Capping Layer for Cu Interconnections in Microelectronics", Journal of the Electrochemical Society, vol. 157, No. 6, 2010, pp. D341-D345.

Benzotriazole, Wikipedia via https://en.wikipedia.org/wiki/Benzotriazole; pp. 1-5, no date available.

Bernal-Ramos, et al., "Atomic Layer Deposition of Cobalt Silicide Thin Films Studied by in Situ Infrared Spectroscopy", Chem. Mater. 2015, 27, pp. 4943-4949.

Bouteville et al., "Selective R.T.L.P.C.V.D. of Tungsten by Silane Reduction on Patterned PPQ/Si Wafers" Journal De Physique IV, Colloque C2, suppl. au Journal de Physique II, vol. 1, Sep. 1991, pp. C2-857-C2-864.

Burton, B.B. et al., "Atomic Layer Deposition of MgO Using Bis(ethylcyclopentadienyl)magnesium and H20". J. Phys. Chem. C, 2009, 113, 1939-1946.

Burton, B.B., et al., "Si02 Atomic Layer Deposition Using Tris(dimethylamino)silane and Hydrogen Peroxide Studied by in Situ Transmission FTIR Spectroscopy". J. Phys. Chem. C, 2009, 113, 8249-8257.

Carlsson, J., "Precursor Design for Chemical Vapour Deposition", Acta Chemica Scandinavica, vol. 45, 1991, pp. 864-869.

Chang et al, "Influences of damage and contamination from reactive ion etching on selective tungsten deposition in a low-pressure chemical-vapor-deposition reactor", J. Appl. Phys., vol. 80, No. 5, Sep. 1, 1996, pp. 3056-3061.

Chen et al., Highly Stable Monolayer Resists for Atomic Layer Deposition on Germanium and Silicon, Chem. Matter, vol. 18, No. 16, pp. 3733-3741, 2006.

Cho et al., "Atomic layer deposition of Al2O3 thin films using dimethylaluminum isopropoxide and water", Journal of Vacuum Science & Technology A 21, (2003), doi: 10.1116/1.1562184, pp. 1366-1370.

Coclite, et al.; 25th Anniversary Article: CVD Polymers: A New Paradigm for Surface Modification and Device Fabrication; Advanced Materials; Oct. 2013; 25; pp. 5392-5423.

Elam et al., "Kinetics of the WF6 and Si2H6 surface reactions during tungsten atomic layer deposition", Surface Science, vol. 479, 2001, pp. 121-135.

Elam et al., "Nucleation and growth during tungsten atomic layer deposition on SiO2 surfaces", Thin Solid Films, vol. 386, 2001 pp. 41-52.

Ellinger et al., "Selective Area Spatial Atomic Layer Deposition of ZnO, Al2O3, and Aluminum-Doped ZnO Using Poly(vinyl pyrrolidone)", Chem. Mater. 2014, 26, pp. 1514-1522.

Fabreguette et al., Quartz crystal microbalance study of tungsten atomic layer deposition using WF6 and Si2H6, Thin Solid Films, vol. 488, 2005, pp. 103-110.

Farm et al. Selective-Area Atomic Layer Deposition Using Poly(methyl methacrylate) Films as Mask Layers, J. Phys. Chem. C, 2008, 112, pp. 15791-15795. (Year: 2008).

Farm et al., "Self-Assembled Octadecyltrimethoxysilane Monolayers Enabling Selective-Area Atomic Layer Deposition of Iridium", Chem. Vap. Deposition, 2006, 12, pp. 415-417.

Farr, Isaac Vincent; Synthesis and Characterization of Novel Polyimide Gas Separation Membrane Material Systems, Chapter 2; Virginia Tech Chemistry PhD Dissertation; URN # etd-080999-123034; Jul. 26, 1999.

Formic Acid, Wikipedia via https://en.wikipedia.org/wiki/Formic_acid; pp. 1-5, no date available.

George, Steven M.; Atomic Layer Deposition: An Overview; Chem. Rev. 2010, 110, pp. 111-131; Feb. 12, 2009.

Ghosal et al., Controlling Atomic Layer Deposition of Ti02 in Aerogels through Surface Functionalization, Chem. Matter, vol. 21, pp. 1989-1992, 2009.

Grubbs et al., "Nucleation and growth during the atomic layer deposition of W on Al2O3 and Al2O3 on W", Thin Solid Films, vol. 467, 2004, pp. 16-27.

Hashemi et al., "A New Resist for Area Selective Atomic and Molecular Layer Deposition on Metal-Dielectric Patterns", J. Phys. Chem. C 2014, 118, pp. 10957-10962.

Hashemi et al., "Selective Deposition of Dieletrics: Limits and Advantages of Alkanethiol Blocking Agents on Metal-Dielectric Patterns", ACS Appl. Mater. Interfaces 2016, 8, pp. 33264-33272.

Hymes et al., "Surface cleaning of copper by thermal and plasma treatment in reducing and inert ambients", J. Vac. Sci. Technol. B, vol. 16, No. 3, May/Jun. 1998, pp. 1107-1109.

International Search Report and Written Opinion dated Feb. 17, 2012 in Application No. PCT/US2011/039970, filed Jun. 10, 2011.

International Search Report and Written Opinion dated Aug. 8, 2018 in Application No. PCT/US2018/030974, filed May 3, 2018.

International Search Report and Written Opinion dated Jul. 24, 2018 in Application No. PCT/US2018/030979, filed May 3, 2018.

King, Dielectric Barrier, Etch Stop, and Metal Capping Materials for State of the Art and beyond Metal Interconnects, ECS Journal of Solid State Science and Technology, vol. 4, Issue 1, pp. N3029-N3047, 2015.

Klaus et al., Atomic layer deposition of tungsten using sequential surface chemistry with a sacrificial stripping reaction, Thin Solid Films, 2000, vol. 360, pp. 145-153.

Klaus et al., Atomically controlled growth of tungsten and tungsten nitride using sequential surface reactions, Applied Surface Science, 2000, vol. 162-163, pp. 479-491.

Kukli et al., "Properties of hafnium oxide films grown by atomic layer deposition from hafnium tetraiodide and oxygen", J. Appl. Phys., vol. 92, No. 10, Nov. 15, 2002, pp. 5698-5703.

Lecordier et al., "Vapor-deposited octadecanethlol masking layer on copper to enable area selective Hf3N4 atomic layer deposition on dielectrics studied by in situ spectroscopic ellipsometry", J. Vac. Sci. Technol. A36(3), May/Jun. 2018, pp. 031605-1-031605-8.

Lee et al., Area-Selective Atomic Layer Deposition Using Self-Assembled Monolayer and Scanning Probe Lithography, Journal of the Electrochemical Society, vol. 156, Issue 9, pp. G125-G128, 2009.

(56) References Cited

OTHER PUBLICATIONS

Lei et al., "Real-time observation and opitimization of tungsten atomic layer deposition process cycle", J. Vac. Sci. Technol. B, vol. 24, No. 2, Mar./Apr. 2006, pp. 780-789.
Lemonds, Andrew Michael, "Atomic Layer Deposition and Properties of Refractory Transition Metal-Based Copper-Diffusion Barriers for ULSI Interconnect", The University of Texas at Austin, 2003, pp. 1-197.
Lemonds, A.M., "Atomic layer deposition of TaSix thin films on SiO2 using TaF5 and Si2H6", Thin Solid Films 488, 2005 pp. 9-14.
Leusink et al., "Growth kinetics and inhibition of growth of chemical vapor deposited thin tungsten films on silicon from tungsten hexafluoride", J. Appl. Phys., vol. 72, No. 2, Jul. 15, 1992, pp. 490-498.
Liang et al., "Growth of Ge Nanofilms Using Electrochemical Atomic Layer Deposition, with a "Bait and Switch" Surface-Limited Reaction". Journal of the American Chemical Society, 2011, 133, 8199-8024.
Lohokare et al., "Reactions of Disilane on Cu(111): Direct Observation of Competitive Dissociation, Disproportionation, and Thin Film Growth Processes", Langmuir 1995, vol. 11, pp. 3902-3912.
Low et al., Selective deposition of CVD iron on silicon dioxide and tungsten, Microelectronic Engineering 83, pp. 2229-2233, 2006.
Mackus et al., Influence of Oxygen Exposure on the Nucleation of Platinum Atomic Layer Deposition: Consequences for Film Growth, Nanopatterning, and Nanoparticle Synthesis, Chem. Matter, vol. 25, pp. 1905-1911, 2013.
Mackus et al., Local deposition of high-purity Pt nanostructures by combining electron beam induced deposition and atomic layer deposition, Journal of Applied Physics, vol. 107, pp. 116102-1-116102-3, 2010.
Mackus et al., "The use of atomic layer deposition in advanced nanopatterning", Nanoscale, 2014, 6, pp. 10941-10960.
Maluf et al., "Selective tungsten filling of sub-0.25μm trenches for the fabrication of scaled contacts and x-ray masks", J. Vac. Sci. Technol. B, vol. 8, No. 3, May/Jun. 1990, pp. 568-569.
Norrman, et al.; 6 Studies of Spin-Coated Polymer Films; Annu. Rep. Prog. Chem.; Sect. C; 2005; 101; pp. 174-201.
Office Action dated Jun. 8, 2017 in Korean Application No. 2013-7000596.
Overhage et al., Selective Atomic Layer Deposition (SALD) of Titanium Dioxide on Silicon and Copper Patterned Substrates, Journal of Undergraduate Research 4, Mar. 29, 2011 in 4 pages.
Parulekar et al., Atomic Layer Deposition of Zirconium Oxide on Copper Patterned Silicon Substrate, Journal of Undergraduate Research, vol. 7, pp. 15-17, 2014.
Parulekar et al., Selective atomic layer deposition of zirconium oxide on copper patterned silicon substrate, pp. 1-6, 2013.
Prasittichai et al., "Area Selective Molecular Layer Deposition of Polyurea Film", Applied Materials & Interfaces, 2013, vol. 5, pp. 13391-13396.
Proslier et al., "Atomic Layer Deposition and Superconducting Properties of NbSi Films", The Journal of Physical Chemistry C, 2011, vol. 115, No. 50, pp. 1-26.
Putkonen, et al.; Atomic Layer Deposition of Polyimide Thin Films; Journal of Materials Chemistry; 2007, 17, pp. 664-669.
Ratta, Varun; Crystallization, Morphology, Thermal Stability and Adhesive Properties of Novel High Performance Semicrystalline Polyimides, Chapter 1; Virginia Tech Chemistry PhD Dissertation; URN # etd-051799-162256; Apr. 26, 1999.
Roberts et al., "Selective Mn deposition on Cu lines", poster presentation, 12th International Conference on Atomic Layer Deposition, Jun. 19, 2012, Dresden, Germany.
Sapp, et al.; Thermo-Mechanical and Electrical Characterization of Through-Silicon Vias with a Vapor Deposited Polyimide Dielectric Liner; IEEE; 2012.
Schmeißer, Decomposition of formic acid, Chemnitz University of Technology, pp. 1-13, Aug. 31, 2011.
Schmeißer, Reduction of Copper Oxide by Formic Acid an ab-initio study, Chemnitz University of Technology, pp. 1-42, Sep. 2011.
Schuisky et al., "Atomic Layer Deposition of Thin Films Using O2 as Oxygen Source", Langmuir, vol. 17, No. 18, 2001, pp. 5508-5512.
Selvaraj et al., Selective atomic layer deposition of zirconia on copper patterned silicon substrates using ethanol as oxygen source as well as copper reductant, Journal of Vacuum Science & Technology A, vol. 32, No. 1, pp. 010601-1-010601-4, Jan. 2014.
Senesky et al., "Aluminum nitride as a masking material for the plasma etching of silicon carbide structures," 2010, IEEE, pp. 352-355.
Sundberg, et al.; Organic and Inorganic—Organic Thin Film Structures by Molecular Layer Deposition: A Review; Beilstein J. Nanotechnol; 2014, 5, pp. 1104-1136.
Suntola, Tuomo, "Thin Films and Epitaxy Part B: Grown mechanism and Dynamics", Handbook of Crystal Growth vol. 3, Elsevier, 1994, 33 pages.
Ting, et al., "Selective Electroless Metal Deposition for Integrated Circuit Fabrication", J. Electrochem. Soc., vol. 136, No. 2, Feb. 1989, pp. 456-462.
Toirov, et al.; Thermal Cyclodehydration of Polyamic Acid Initiated by UV-Irradiation; Iranian Polymer Journal; vol. 5, No. 1; pp. 16-22; 1996; Iran.
"Tungsten and Tungsten Silicide Chemical Vapor Deposition", TimeDomain CVD, Inc., retrieved from link: http://www.timedomaincvd.com/CVD_Fundamentals/films/W_WSi.html, Last modified Jul. 11, 2008.
Vallat et al., Selective deposition of Ta2O5 by adding plasma etching super-cycles in plasma enhanced atomic layer deposition steps, Journal of Vacuum Science & Technology A, vol. 35, No. 1, pp. 01B104-1-01B104-7, Jan. 2017.
Vervuurt et al., "Area-selective atomic layer deposition of platinum using photosensitive polyimide", Nanotechnology 27, 2016, in 6 pages.
Yu et al., "Gas/surface reactions in the chemical vapor deposition of tungsten using WF6/SiH4 mixtures", J. Vac. Sci. Technol. A, vol. 7, No. 3, May/Jun. 1989, pp. 625-629.
Zhou, et al.; Fabrication of Organic Interfacial Layers by Molecular Layer Deposition: Present Status and Future Opportunities; Journal of Vacuum Science & Technology; A 31 (4), 040801-1 to 040801-18; 2013.

* cited by examiner

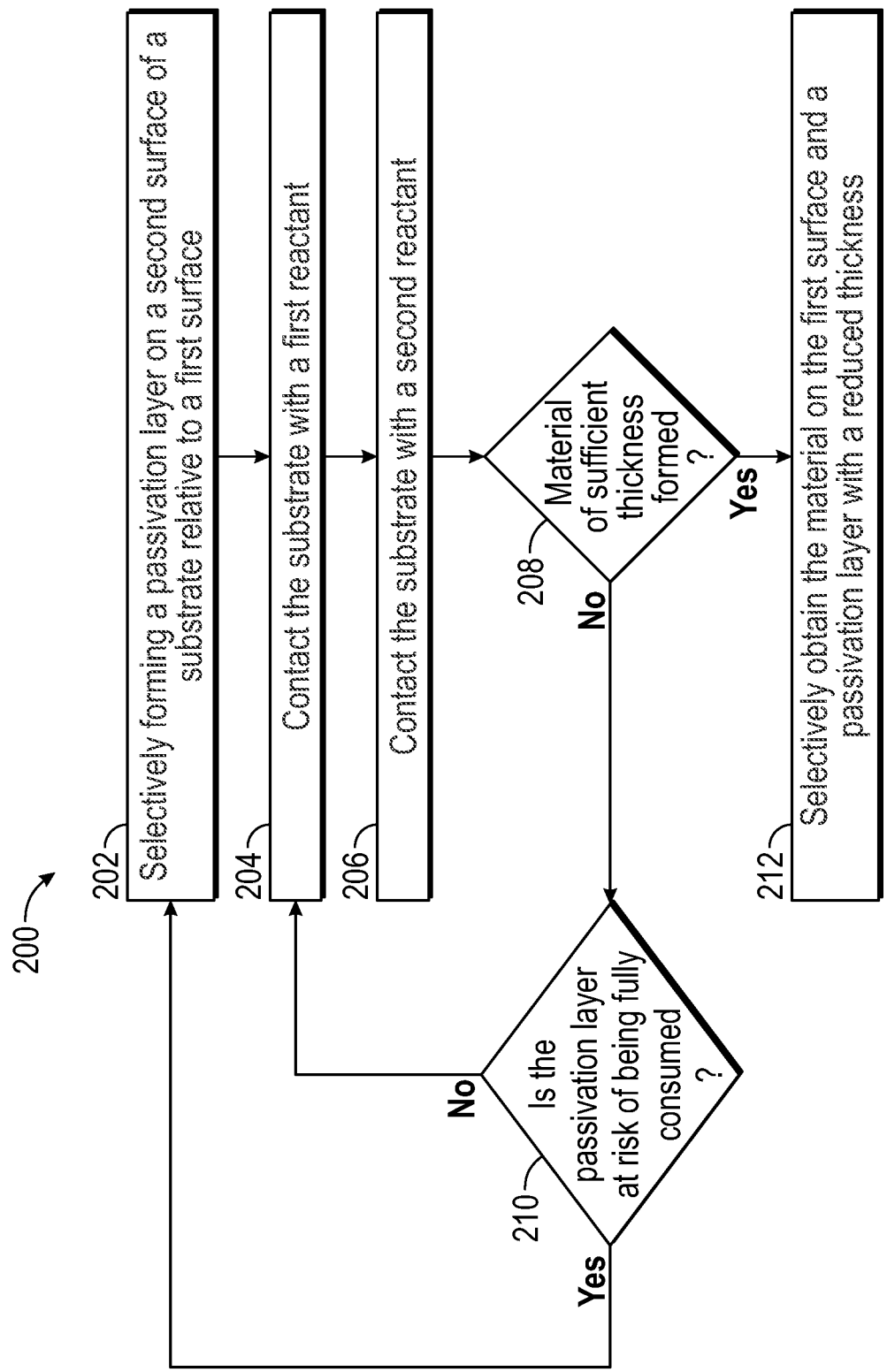

SELECTIVE LAYER FORMATION USING DEPOSITION AND REMOVING

CROSS-REFERENCE TO RELATED APPLICATIONS

The present application is a continuation of U.S. application Ser. No. 17/113,383, filed Dec. 7, 2020, which is a continuation of U.S. patent application Ser. No. 16/399,328, filed Apr. 30, 2019, now U.S. Pat. No. 10,872,765, which claims priority to U.S. Provisional Patent Application No. 62/666,039, filed May 2, 2018, the disclosures of each of which are incorporated herein by reference in their entireties for all purposes.

BACKGROUND

Field

The present disclosure relates generally to the field of semiconductor device manufacturing and, more particularly, to selective formation of layers employing deposition and removal of films.

Description of the Related Art

In the semiconductor industry, there is an increasing need for selective processes. For example, film growth may be desired on one surface but not on a second, different surface. These two different surfaces can comprise different materials, for example a metal and a dielectric. Good selective processes could reduce the number process steps by avoiding more complicated processes for separate patterning of the deposited material, such as photolithographic masking and patterning, thus saving time and money.

SUMMARY

In one aspect a method is provided for an atomic layer deposition (ALD) process for selectively forming a dielectric material on a first surface of a patterned substrate. The method includes providing a substrate comprising a first surface and a second surface, wherein the second surface comprises a passivation layer thereover. The method further includes conducting at least one deposition cycle comprising alternately and sequentially contacting the substrate with a first precursor and a second reactant comprising oxygen. The method further includes wherein the second reactant reacts with the first precursor to form a dielectric material on the first surface, and wherein the passivation layer is ashed by the second reactant during each deposition cycle.

In some embodiments, the method for an ALD process further includes wherein the first surface is a dielectric surface. In some embodiments, the dielectric surface comprises silicon oxide. In some embodiments, the first surface comprises a low-k material. In some embodiments, the second surface is a metal surface. In some embodiments, the metal surface comprises at least one of Co, Cu or W. In some embodiments, the dielectric material is an oxide. In some embodiments, the oxide is silicon oxide. In some embodiments, the oxide is a metal oxide.

In some embodiments, the first precursor comprises a metal precursor, a silicon precursor, or mixtures thereof. In some embodiments, the first precursor is an alkylaminosilane.

In some embodiments, the passivation layer comprises an organic material. In some embodiments, the passivation layer is selectively deposited on the second surface relative to the first surface prior to beginning the first deposition cycle. In some embodiments, the deposition cycle is repeated a plurality of times to form an oxide film of a desired thickness on the dielectric surface. In some embodiments, additional passivation layer is selectively deposited on the passivation layer between the beginning and end of each deposition cycle.

In some embodiments, the ALD process is a plasma enhanced atomic layer deposition (PEALD) process. In some embodiments, the at least one deposition cycle begins with contacting the substrate with the second reactant before contact with the first precursor. In some embodiments, the at least one deposition cycle further comprises contacting the substrate with at least one additional reactant in each cycle. In some embodiments, the second reactant further comprises plasma. In some embodiments, contacting the substrate with the second reactant further comprises activating the second reactant with plasma.

In some embodiments, the dielectric material is selectively formed on the first surface relative to the passivation layer. In some embodiments, the dielectric material is formed on the passivation layer and the dielectric material is removed from the passivation layer with the ashing of the passivation layer, thereby selectively forming the dielectric material on the first surface.

In another aspect a cyclical deposition process is provided for selectively a forming a material on a surface of a patterned substrate. The method includes providing a substrate comprising a first surface and a second surface, wherein the second surface comprises a passivation layer thereover. The method further includes conducting at least one deposition cycle comprising alternately and sequentially contacting the substrate with a first precursor and a second reactant. The second reactant reacts with the first precursor to form the material on the first surface, and the passivation layer is etched by the second reactant during each deposition cycle.

In some embodiments, the process comprises atomic layer deposition (ALD). In some embodiments, the process comprises plasma enhanced ALD (PEALD). In some embodiments, the second reactant comprises plasma-activated species. In some embodiments, the second reactant comprises oxygen, the passivation layer comprises an organic layer, and etching comprises ashing. In some embodiments, the passivation layer comprises a polymer.

In some embodiments, deposition is halted before the etching of the passivation layer exposes the second surface. In some embodiments, the method includes further depositing additional passivation layer over the second surface after halting the deposition and prior to continuing the deposition.

In another aspect a plasma enhanced atomic layer deposition (PEALD) process is provided for selectively forming an oxide material on a first dielectric surface of a patterned substrate. The method includes providing a substrate comprising a first dielectric surface and a second metallic surface, wherein the second metallic surface comprises an organic passivation layer thereover. The method further includes conducting at least one deposition cycle comprising alternately and sequentially contacting the substrate with a first precursor and a second reactant comprising oxygen and plasma. The second reactant reacts with the first precursor to form an oxide material on the first dielectric surface, and the organic passivation layer is ashed by the second reactant during each deposition cycle.

BRIEF DESCRIPTION OF THE DRAWINGS

FIG. 1B is a flow diagram illustrating a selective deposition process for depositing a material on a first surface while reducing the thickness of a passivation layer selectively deposited over a second surface.

DETAILED DESCRIPTION

Dielectric films, such as metal oxide or silicon oxide (e.g., SiO) films, have a wide variety of applications, as will be apparent to the skilled artisan, for example in integrated circuit fabrication. According to some embodiments of the present disclosure, various dielectric films, particularly oxide films, precursors, and methods for depositing such films are provided.

In some embodiments, a material is formed on a first surface of a substrate relative to a second surface by a selective deposition process. In some embodiments, the material is an oxide material. In some embodiments, a dielectric film is formed selectively using a cyclical deposition process on a dielectric surface of a substrate relative to a passivation layer on a metal surface.

Figure 1A:
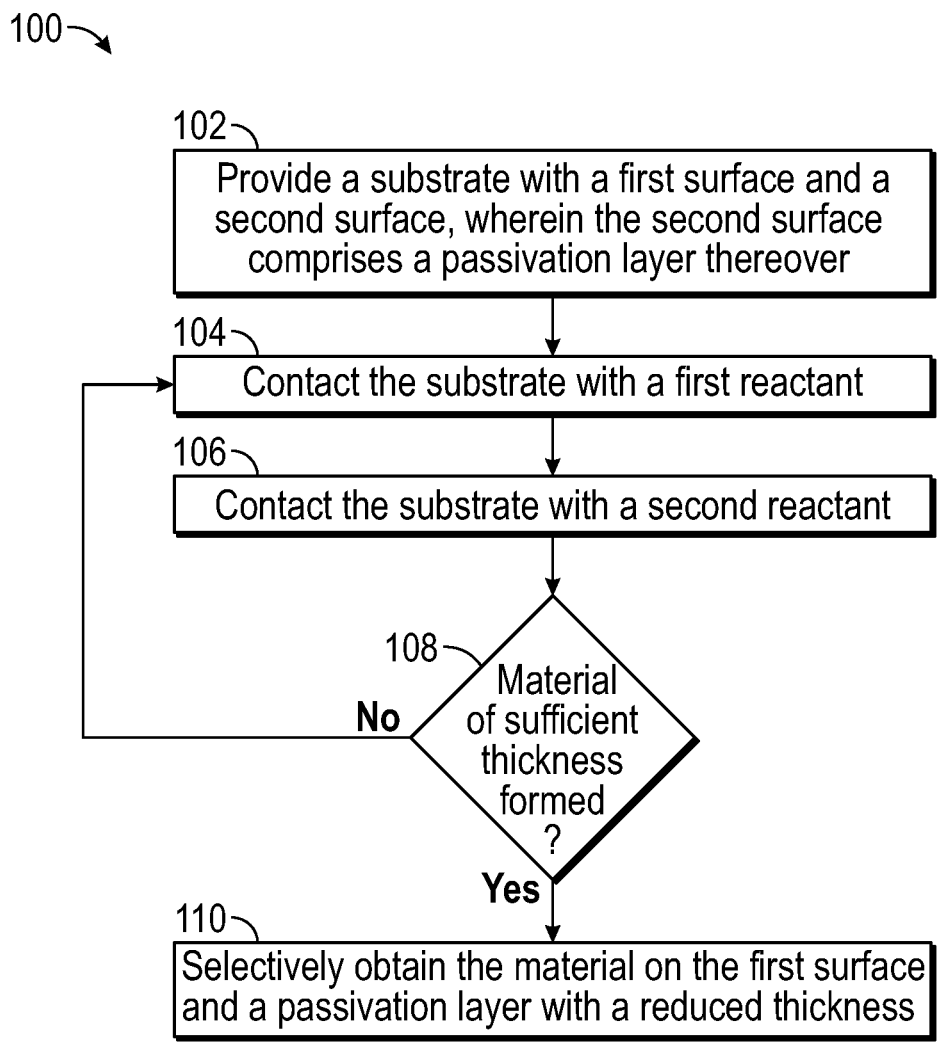
FIG. 1A is a flow diagram illustrating a selective deposition process for depositing a material on a first surface while reducing the thickness of a passivation layer over a second surface.

For example, FIG. 1A is a flow diagram 100 illustrating a selective deposition process of depositing a material on a first surface while reducing the thickness of a passivation layer over a second surface. In the first illustrated block 102 a substrate with a first surface and a second surface is provided, wherein the second surface comprises a passivation layer thereover. In block 104 the substrate is contacted with a first reactant, and in block 106 the substrate is contacted with a second reactant. In some embodiments, blocks 104 and 106 are performed alternately and sequentially. In illustrated decision block 108, the substrate may be repeatedly exposed to the first and second reactants in blocks 104 and 106 until a material of sufficient thickness is formed. In some embodiments, a sufficiently thick material is formed and therefore blocks 104 and 106 are not repeated. In some embodiments, a sufficiently thick material is not formed and therefore blocks 104 and 106 are repeated, and the repetition of blocks 104 and 106 is referred to as a cyclical deposition process. Blocks 104 and 106 need not be in the same sequence nor identically performed in each repetition. In some embodiments, blocks 104 and 106 are performed consecutively. In some embodiments, blocks 104 and 106 are separated by one or more intermittent processes. In some embodiments, the repetition of blocks 104 and 106 are performed consecutively. In some embodiments, the repetition of blocks 104 and 106 is separated by one or more intermittent processes. In some embodiments, intermittent processes may be selected from at least one of excess reactant and byproduct removal (e.g., vacuum and/or inert gas purge), selective deposition of an additional passivation layer, additional clean up etch, repeated exposure of the same reactant prior to exposure of another reactant, and/or exposure to an additional reactant in some or all cycles. Intervening removal of excess reactant and byproduct aids in separating the supply of different reactants to minimize risk of gas phase interaction and limit the deposition reactions to surface reactions. Skilled artisans will appreciate that some interactions with residual gases may be tolerated in order to minimize duration of the intervening removal (e.g., purge) steps. Avoiding overlap in the supply of reactants to the reaction space typically reduces gas phase reactions sufficiently, and optimization of flow paths together with intervening purging can further minimize residual gas interactions. Once a desired material is thickness is formed, the selective deposition process is completed in block 110, where the material is selectively obtained on a first surface and a passivation layer with a reduced thickness is obtained on the second surface. Reactants can be precursors that leave one or more elements in the deposited film. In some embodiments, one or more reactants can serve to chemically reduce, oxidize or getter products of the deposited material.

Similar to FIG. 1A, FIG. 1B is an example flow diagram 200 illustrating the selective deposition of a material on a first surface while reducing the thickness of a passivation layer, however FIG. 1B includes selectively forming a passivation layer on a second surface. It is to be understood that any of the same or similar features or functions discussed with regard to FIG. 1A may also be applied to the same or similar features or functions of FIG. 1B. In the first illustrated block 202 a passivation layer is selectively formed on a second surface of a substrate relative to a first surface. In block 204 the substrate is contacted with a first reactant, and in block 206 the substrate is contacted with a second reactant. In illustrated decision block 208, a sufficiently thick material may be formed and therefore the material is selectively obtained on the first surface with a passivation layer of a reduced thickness as shown in block 212. If a sufficiently thick material is not yet formed and if the passivation layer is not at risk of being fully consumed by exposure to the reactants, decision block 210 illustrates that the substrate may be repeatedly and alternately exposed to the first and second reactants in blocks 204 and 206. Alternatively, if the passivation layer is at risk of being fully consumed by exposure to the reactants, decision block 210 illustrates that first illustrated block 202 may be repeated where a passivation layer is selectively formed on a second surface of a substrate relative to a first surface before the substrate is exposed to the first and second reactants in blocks 204 and 206.

In some embodiments, the cyclical deposition process is atomic layer deposition (ALD). In some embodiments, the cyclical deposition process is cyclical chemical vapor deposition (CVD). In some embodiments, the passivation layer was previously deposited on the second surface (for example, the metal surface). In some embodiments, the passivation layer is partially removed during the cyclical deposition process. During an ALD process, for example, the passivation layer may be slowly removed, such as by etching, during ALD phases. For example, for an organic (e.g., polymer) passivation layer, etching (e.g., ashing) may be accomplished during deposition phases in which oxidants are supplied, while simultaneously a dielectric film is deposited on the dielectric surface. In another example, a passivation layer is simultaneously removed while an oxide material is deposited on the dielectric surface during exposure of the substrate to a second reactant in the ALD process. The slow etching of the passivation layer may prevent deposition of the dielectric on the passivation layer and on the metal.

In some embodiments, the ALD process may be a plasma enhanced atomic layer deposition process (PEALD). In some embodiments, plasma power is provided to generate more reactive species from reactants containing oxygen. In some embodiments, reactant containing oxygen comprises $O_2$ gas, which is subjected to plasma generating power. In some embodiments, the plasma may be generated remotely from the deposition chamber and plasma products supplied to the deposition chamber. In some remote plasma embodiments, the delivery path optimizes delivery of neutral O species while minimizing ion delivery to the substrate. In some embodiments, the plasma may be generated in situ within the deposition chamber.

In some embodiments, the first surface of the substrate comprises a dielectric surface. In some embodiments, the dielectric surface of the substrate comprises a silicon oxide (e.g., $SiO_2$). In some embodiments, the dielectric surface of the substrate comprises a low-k material.

In some embodiments, the second surface comprises a metal surface. Unless otherwise indicated, if a surface is referred to as a metal surface herein, it may be a metal surface or a metallic surface. In some embodiments the metal or metallic surface may comprise metal, metal oxides, and/or mixtures thereof. In some embodiments the metal or metallic surface may comprise surface oxidation. In some embodiments the metal or metallic material of the metal or metallic surface is electrically conductive with or without surface oxidation. In some embodiments metal or a metallic surface comprises one or more transition metals. In some embodiments the metal or metallic surface comprises one or more of Al, Cu, Co, Ni, W, Nb, Fe. In some embodiments the metal or metallic surface comprises at least one of Co, Cu or W. In some embodiments the metal or metallic surface comprises one or more noble metals, such as Ru. In some embodiments the metal or metallic surface comprises a conductive metal oxide, nitride, carbide, boride, or combination thereof. For example, the metal or metallic surface may comprise one or more of $RuO_x$, $NbC_x$, $NbB_x$, $NiO_x$, $CoO_x$, $NbO_x$ and $WNC_x$. In some embodiments the substrate may comprise a metal nitride, including, but not limited to TiN and/or TaN. In some embodiments the metal surface may comprise a metal carbide, including, but not limited to TiC and/or TaC. In some embodiments the metal surface may comprise a metal chalcogenide, including, but not limited to $MoS_2$, $Sb_2Te_3$, and/or GeTe. In some embodiments the metal surface is a TiN surface. In some embodiments the metal surface is a W surface.

Selectivity

Selectivity can be given as a percentage calculated by [(deposition on first surface)-(deposition on second surface)]/(deposition on the first surface). Deposition can be measured in any of a variety of ways. In some embodiments deposition may be given as the measured thickness of the deposited material. In some embodiments deposition may be given as the measured amount of material deposited.

In some embodiments selectivity is greater than about 10%, greater than about 50%, greater than about 75%, greater than about 85%, greater than about 90%, greater than about 93%, greater than about 95%, greater than about 98%, greater than about 99% or even greater than about 99.5%. In embodiments described herein, the selectivity can change over the duration or thickness of a deposition.

In some embodiments deposition of the dielectric, such as an oxide, only occurs on the first dielectric surface and does not occur on the passivation layer over the second metal surface. In some embodiments deposition on the first surface of the substrate relative to the passivation layer is at least about 80% selective, which may be selective enough for some particular applications. In some embodiments the deposition on the first surface of the substrate relative to the passivation layer is at least about 50% selective, which may be selective enough for some particular applications. In some embodiments the deposition on the first surface of the substrate relative to the passivation layer is at least about 10% selective, which may be selective enough for some particular applications.

In some embodiments the passivation layer may be selectively formed on the metal surface prior to selective deposition of the dielectric material on the dielectric surface. For example, in some embodiments, a passivation layer may be blanket deposited on a patterned substrate, and patterned and etched by traditional processes to leave the passivation layer selectively where the subsequent deposition is to be avoided, such as over a metal surface. In other embodiments, a passivation layer may be selectively deposited on a metal layer. Selective deposition of a passivation layer may be carried out, for example, as described below, and as described in US Patent Publication No. 2017-0352533 A1 (application Ser. No. 15/170,769) or US Patent Publication No. 2017-0352550 A1 (application Ser. No. 15/486,124), the entire disclosure of each of which is incorporated by reference herein in its entirety.

As noted above, the selective formation of the passivation layer over metal surfaces need not be 100% selective in order to achieve 100% selectivity. For example, the passivation layer deposition may be partially selective such that it is formed to be thicker over the metal surface than over the dielectric surface. A subsequent short, timed etch of the passivation material may be conducted for a duration to expose the dielectric surface while leaving some passivation layer covering the metal surface.

ALD Process

According to some embodiments, a dielectric film is deposited on a first surface of a substrate with an oxygen based ALD process. In some embodiments, the deposited dielectric film may be, for example, silicon oxide (e.g., $SiO_2$) or other metal oxide that can be grown with a PEALD process. In some embodiments, the deposited dielectric film can comprise $SiO_2$, $TiO_2$, $ZrO_2$, $HfO_2$, $Nb_2O_5$, $Ta_2O_5$, $WO_3$, NiO and combinations thereof. The second surface of the substrate may be covered by a passivation layer. In some embodiments, the passivation layer is an organic layer. The organic passivation layer may be a polymer, such as polyimide or polyamide.

In some embodiments, an oxide material film is deposited on a first surface of a substrate with an oxygen based ALD process. In some embodiments, the deposited oxide material film may be a conductive oxide film. For example, in some embodiments the conductive oxide film is an indium tin oxide (ITO) film. In some embodiments, the deposited oxide material film may be a dielectric film, as described herein.

In some embodiments, the passivation layer inhibits oxide material film and/or dielectric film deposition there. However, in some embodiments, the passivation layer does not inhibit deposition of the oxide material film or dielectric film, that is, the oxide material film or dielectric film chemistry may not be selective as between the underlying dielectric substrate surface and the passivation layer. This is due to the fact that conditions are selected to ensure some removal of the passivation layer during the ALD process, thus undercutting and removing any deposition of the oxide material film or dielectric film over the passivation layer. As the passivation layer is sacrificial, the passivation layer is slowly removed (e.g., etched) during one of the cyclical deposition phases. For example, in an ALD sequence, an organic (e.g., polymer) passivation layer may be slowly ashed by an oxidant phase of the ALD sequence, which prevents oxide material film or dielectric film growth on the passivation layer. In another example, in an ALD sequence, a passivation layer is removed during exposure of the substrate to a second reactant in the ALD process, which prevents oxide material film or dielectric film growth on the passivation layer. Relative to the growth over the passivation layer, the oxide material film or dielectric film is deposited normally (non-selectively, or with low selectivity) on the dielectric surface. Regardless of whether the oxide material film or dielectric material is deposited normally or selectively on the dielectric surface, slowly etching (e.g., ashing) the sacrificial passivation layer by an oxidant phase of the ALD sequence has the end effect of selectively forming the oxide material film or dielectric material on the dielectric substrate relative to the passivation layer. Thus, using the process of FIG. 1A or 1B can effectively increase selectivity of the formation of the oxide material film or dielectric film.

In some embodiments, before deposition of the oxide material film or dielectric film is performed but after the passivation layer is formed, any passivation layer remaining on the dielectric surface can be removed with a plasma pretreatment with suitable parameters. In some embodiments, rather than a separate process to remove any passivation material from over the dielectric surface, any passivation layer remaining on the dielectric surface is removed by initial phases of the ALD process, including oxidation phase, or by simply conducting the oxidation phase of the ALD process before initiating the full ALD process wherein after the thinner passivation layer on dielectric is completely ashed the oxide material film or dielectric film deposition process begins. Thus, the ALD sequence may start with the second reactant, including oxidant, to serve for a short timed etch of undesired passivation material from the first surface, without removal of all the passivation material from the second surface, before selective deposition on the first surface.

In some embodiments, the oxidation phase of the ALD process is a plasma process in a PEALD sequence. In some embodiments, the plasma is oxygen based. For example, the plasma may be generated in $O_2$ gas or a mixture of $O_2$ and a noble gas, such as Ar. In some embodiments the plasma may be generated in a gas comprising oxygen, or may otherwise comprise excited oxygen species. In some embodiments, the oxidation phase of the ALD process is a non-plasma oxidation process (e.g., $H_2O$ or $O_3$).

In some embodiments plasma, for example oxygen containing plasma, may be generated by applying RF power of from about 10 W to about 2000 W, from about 50 W to about 1000 W, from about 100 W to about 500 W, from about 30 W to 100 W, or about 100 W in some embodiments. In some embodiments the RF power density may be from about 0.02 $W/cm^2$ to about 2.0 $W/cm^2$, or from about 0.05 $W/cm^2$ to about 1.5 $W/cm^2$. The RF power may be applied to a reactant that flows during the plasma contacting time, that flows continuously through the reaction chamber, and/or that flows through a remote plasma generator. Thus in some embodiments the plasma is generated in situ, while in other embodiments the plasma is generated remotely. In some embodiments a showerhead reactor is utilized and plasma is generated in situ between a susceptor (on top of which the substrate is located) and a showerhead plate. In some embodiments the gap between the susceptor and showerhead plate is from about 0.1 cm to about 20 cm, from about 0.5 cm to about 5 cm, or from about 0.8 cm to about 3.0 cm.

Figure 2:
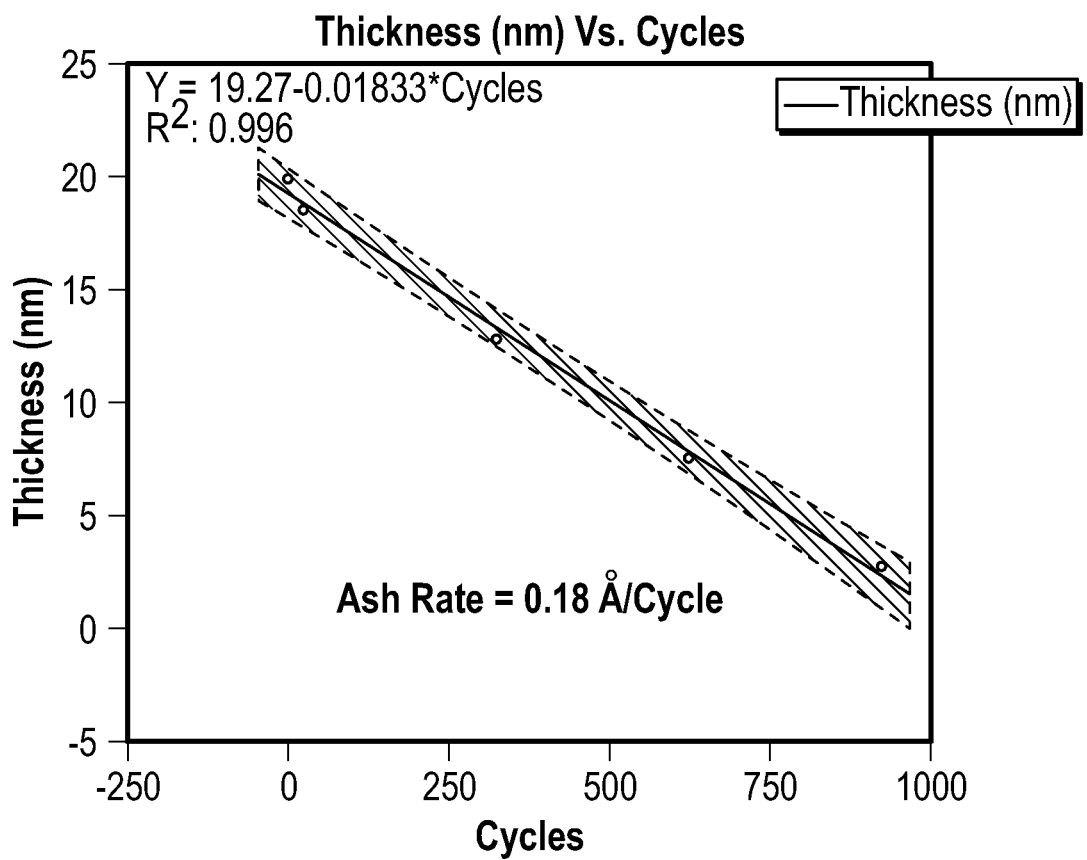
FIG. 2 is a graph of some embodiments showing the thickness of a polyimide layer versus the number of cycles of oxidation performed, wherein a passivation ash rate is calculated.

The thickness of the oxide film that can be formed on dielectric surface before the passivation layer is completely removed depends on the passivation layer initial thickness, ash rate of the passivation layer, and the growth rate of the oxide deposition process. For example, FIG. 2 demonstrates that with an ash rate of ~0.2 Å/cycle, a 20 nm sacrificial polyimide layer on a metal surface, and a growth per cycle (GPC) of 1 Å/cycle, 50 nm of $SiO_2$ may be deposited on a dielectric surface by applying 500 cycles of the oxygen based PEALD process. FIG. 2 shows the ash rate of polyimide when exposed to oxidant phases in which argon is supplied at 700 sccm, $O_2$ is supplied at 100 sccm, pressure is kept at 2 Torr, plasma power is set to 100 W, substrate temperature is maintained at 100° C., and each oxidant phase includes 1 second of $O_2$ plasma and 1 second of purge. The PEALD would include one phase of the above oxidant phase alternated with supply of a silicon precursor and purge, where the silicon precursor is selected for adsorption on the dielectric or growing silicon oxide film and to react with the oxidant phases to form silicon oxide. In other embodiments, oxidant phases can be alternated with a supply of one or more metal precursor phase(s) and attendant purge phase(s), where the metal precursor is selected to adsorb on the dielectric surface or the growing metal oxide film and to react to with the oxidant phases to form the desired oxide.

In some embodiments, optimization of the etch rate of the sacrificial passivation layer can be tuned so that growth of the oxide material film or dielectric film does not result in net deposition on the passivation layer during the ALD process. In some embodiments, the incubation time for deposition on the passivation layer is sufficiently long enough that a desired oxide layer thickness is deposited on the dielectric surface. In some embodiments a thick enough passivation layer is formed over the metal surface such that a sufficiently thick oxide film may be deposited over the dielectric surface using the ALD process without further depositing another passivation film layer, i.e., without fully consuming the initial passivation layer.

In some embodiments, a selective passivation layer deposition and the selective ALD process are performed in an iterative manner, for example such using the process described in FIG. 1B. This iterative process may enable the thickness of the passivation layer to be replenished after the ALD process is performed, therefore allowing subsequent ALD processes to be performed. For example, if the passivation layer is ashed away in 100 cycles or if the incubation on passivation layer is 100 cycles before the deposited oxide begins to form on the passivation layer faster than it can be removed by undercutting, 90 cycles of a first ALD process may be performed to selectively deposit the oxide on the dielectric surface, deposition of a subsequent passivation layer over the previous passivation layer may be performed, and a second 90 cycles of the ALD process may be performed. In some embodiments, this iterative process may be repeated as many times as desired to obtain a desired oxide layer thickness on the dielectric surface. A person of ordinary skill in the art would appreciate that the number of iterative processes necessary would vary depending on a number of factors such as, for example, the thickness of the deposited oxide desired, the thickness of the passivation layer, and the ash rate or incubation period of the passivation layer.

In some embodiments, the PEALD deposition may be carried out essentially as described above. In other embodiments, the substrate is alternately and sequentially contacted with a first reactant comprising elements to be included in the deposited material, such as a metal or silicon, and a second reactant comprising oxygen, and a second plasma reactant. In some embodiments the second plasma reactant does not comprise oxygen species. In some embodiments no reactants comprising oxygen species are used other than the second reactant. The plasma and precursors (i.e. the first and second reactants) may be provided in pulses separated by a removal process (e.g., purge) in which excess reactant and reaction byproducts, if any, are removed from the reaction space. In some embodiments, a PEALD deposition process begins with the plasma pulse followed by the precursors, and the reaction sequence, or deposition cycle, may be repeated a desired number of times (A):

A×(plasma pulse/purge/precursors/purge)

In some embodiments the deposition cycle begins with the non-plasma precursors, which is then followed by the plasma pulse.

According to some embodiments, PEALD processes utilized may be any suitable oxygen based plasma processes. In some embodiments, the deposited dielectric film is an oxide film. In some embodiments, the deposited dielectric film is a metal oxide film. In some embodiments, the deposited dielectric film may be selected from the group consisting of $SiO_2$, $TiO_2$, $ZrO_2$, $HfO_2$, $Nb_2O_5$, $Ta_2O_5$, $WO_3$ and NiO. In some embodiments, the deposited dielectric film is silicon oxide. In some embodiments, an oxide precursor is an alkylaminosilane, which is used to deposit silicon oxide films.

In some embodiments, an oxide film is selectively formed on a first dielectric surface of a substrate relative to a second, different metal or metallic surface of the substrate by an oxygen-based PEALD process. For example, silicon oxide may be selectively deposited by oxygen-based PEALD on a low-k dielectric surface (e.g., silicon oxide-based surface) relative to a metal surface.

Figure 3:
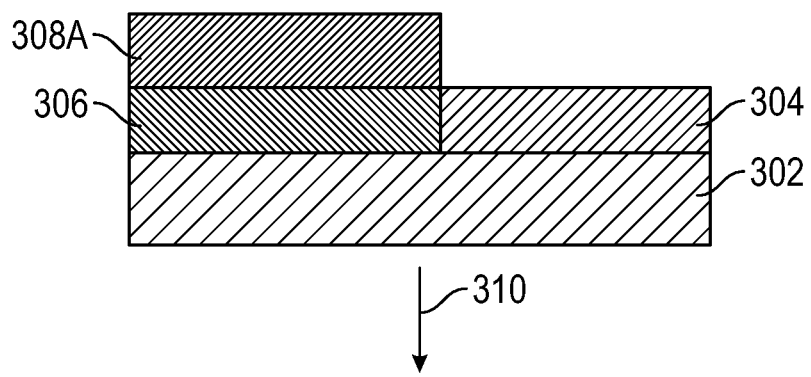
FIG. 3 illustrates the selective deposition of a material on a first surface of a substrate by a cyclical deposition process, while the cyclical deposition process removes a passivation layer over a second surface.
Figure 3:
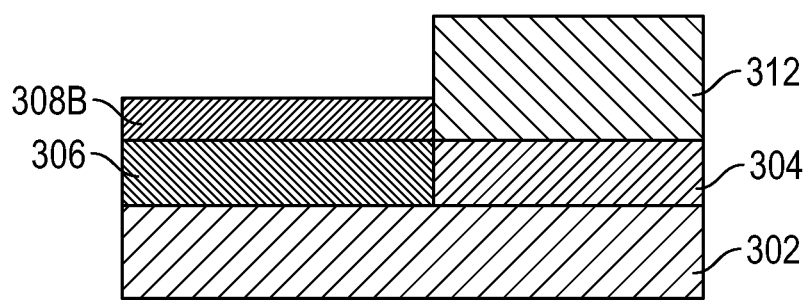

FIG. 3 shows a schematic of some embodiments, wherein a substrate 302 comprises a first surface of a first structure 304 (for example, a dielectric surface of a dielectric layer) and a second surface of a second structure 306 that has a different material composition (for example, a metal surface of a metal layer, such as a cobalt, copper or tungsten surface) further comprising an initial passivation layer 308A having a first thickness (for example, 20 nm of a polyimide organic layer), in which a material 312 is selectively deposited on the first surface relative to the second surface (due to selectively relative to the overlying initial passivation layer 308A). In some embodiments the selectively deposited material 312 is an oxide material. In some embodiments, the oxide material is a dielectric material. In examples described herein, the dielectric oxide is a film of silicon oxide. As can be seen in FIG. 3, after one or more cycles of a selective deposition process 310 (for example, 500 cycles of an oxygen based PEALD silicon oxide deposition process), the material 312 (for example, 50 nm of SiO) is deposited over the first surface of the first structure 304 and the remaining passivation layer 308B has decreased to a second thickness (for example, 10 nm of a polyimide organic layer). In some embodiments, the selective deposition process halts before all of the initial passivation layer is removed. In some embodiments, after the selective deposition process is completed, the reduced thickness of the remaining passivation layer 308B may be subsequently removed (for example, by ashing) without deposition to expose the second surface of the second structure 306.

In some embodiments, the PEALD process disclosed may accomplish selective formation of silicon oxide or other oxides on dielectric surfaces. In some embodiments, the PEALD process disclosed may accomplish a reduction in the number of steps for forming desired patterns in various device manufacturing process flows, relative to convention patterning processes.

It will be understood by those of skill in the art that numerous and various modifications can be made without departing from the spirit of the present invention. The described features, structures, characteristics and precursors can be combined in any suitable manner. Therefore, it should be clearly understood that the forms of the present invention are illustrative only and are not intended to limit the scope of the present invention. All modifications and changes are intended to fall within the scope of the invention, as defined by the appended claims.

What is claimed is:

1. A method of selectively forming a dielectric material on a first surface of a substrate, the method comprising:
providing a substrate comprising a first surface and a second surface, wherein the second surface comprises a passivation layer thereover; and
conducting a cyclical deposition process to selectively form a dielectric material on the first surface, wherein the cyclical deposition process comprises deposition cycles, wherein at least one deposition cycle of the deposition cycles comprises separately contacting the substrate with a precursor and a reactant to form the dielectric material on the first surface, and wherein passivation of the passivation layer on the second surface is removed during the at least one deposition cycle.

2. The method of claim 1, further comprising depositing additional passivation over the passivation layer between two of the deposition cycles.

3. The method of claim 1, wherein the cyclical deposition process is halted before the second surface is exposed by removal of the passivation of the passivation layer.

4. The method of claim 1, wherein the passivation of the passivation layer on the second surface is removed in each of the deposition cycles of the cyclical deposition process that include contacting the substrate with the reactant.

5. The method of claim 1, further comprising selectively depositing the passivation layer on the second surface relative to the first surface prior to beginning a first deposition cycle of the at least one deposition cycle.

6. The method of claim 1, wherein the dielectric material comprises an oxide film.

7. The method of claim 6, wherein the oxide film is a silicon oxide film.

8. The method of claim 6, wherein the oxide film is a metal oxide film.

9. The method of claim 1, wherein said contacting the substrate with the reactant comprises activating the reactant with plasma.

10. The method of claim 1, wherein the cyclical deposition process is a plasma enhanced atomic layer deposition process.

11. The method of claim 1, wherein the first surface is a dielectric surface and the second surface is a metal surface.

12. The method of claim 11, wherein the metal surface comprises at least one of Co, Cu or W.

13. The method of claim 1, wherein the reactant comprises oxygen.

14. The method of claim 1, wherein the passivation layer comprises a polymer.

15. The method of claim 1, wherein the passivation layer comprises an organic material.

16. The method of claim 1, wherein the at least one deposition cycle begins with contacting the substrate with the reactant before contacting the substrate with the precursor.

17. A plasma enhanced method for selectively forming an oxide material on a dielectric surface of a substrate, the plasma enhanced method comprising:
  providing a substrate comprising a dielectric surface and a metallic surface, wherein the metallic surface comprises a passivation layer thereover; and
  conducting deposition cycles to selectively form an oxide material on the dielectric surface, at least one deposition cycle of the deposition cycles comprising separately contacting the substrate with a precursor and a reactant to form the oxide material on the dielectric surface, wherein the reactant comprises oxygen and plasma, and wherein passivation of the passivation layer on the metallic surface is removed by the reactant during the at least one deposition cycle.

18. The plasma enhanced method of claim 17, further comprising depositing passivation material over the metallic surface between a first deposition cycle of the deposition cycles and a last deposition cycle of the deposition cycles.

19. The plasma enhanced method of claim 17, wherein the passivation of the passivation layer is removed in each of the deposition cycles that comprises contacting the substrate with the reactant.

20. The plasma enhanced method of claim 17, wherein the passivation layer comprises a polymer.

* * * * *